United States Patent
Li et al.

(10) Patent No.: US 10,297,678 B2
(45) Date of Patent: May 21, 2019

(54) METHOD FOR MANUFACTURING THIN FILM TRANSISTOR

(71) Applicant: BOE Technology Group Co., Ltd., Beijing (CN)

(72) Inventors: Xiaolong Li, Beijing (CN); Zunqing Song, Beijing (CN); Xiaowei Xu, Beijing (CN); Dong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/989,773

(22) Filed: May 25, 2018

(65) Prior Publication Data

US 2019/0027587 A1   Jan. 24, 2019

(30) Foreign Application Priority Data

Jul. 21, 2017   (CN) .......................... 2017 1 0600827

(51) Int. Cl.
| | | |
|---|---|---|
| *H01L 21/00* | (2006.01) | |
| *H01L 21/84* | (2006.01) | |
| *H01L 29/66* | (2006.01) | |
| *H01L 21/768* | (2006.01) | |
| *H01L 21/324* | (2006.01) | |
| *H01L 21/265* | (2006.01) | |

(52) U.S. Cl.
CPC .. *H01L 29/66757* (2013.01); *H01L 21/26513* (2013.01); *H01L 21/3242* (2013.01); *H01L 21/76895* (2013.01)

(58) Field of Classification Search
CPC ........... H01L 21/26513; H01L 21/3242; H01L 21/76895; H01L 29/66757

USPC ........................................................ 438/152
See application file for complete search history.

(56) References Cited

U.S. PATENT DOCUMENTS

| | | | | |
|---|---|---|---|---|
| 2003/0148565 A1* | 8/2003 | Yamanaka | .......... | H01L 21/2026 438/200 |
| 2007/0093007 A1* | 4/2007 | Deane | ................. | H01L 27/1214 438/154 |
| 2007/0285592 A1* | 12/2007 | Morimoto | ......... | H01L 21/02422 349/42 |
| 2017/0236948 A1* | 8/2017 | Mizumura | .............. | H01L 21/20 257/66 |
| 2018/0350685 A1* | 12/2018 | Or-Bach | ................ | G11C 5/025 |
| 2019/0057986 A1* | 2/2019 | Wang | .................. | H01L 27/1274 |

* cited by examiner

*Primary Examiner* — David S Blum
(74) *Attorney, Agent, or Firm* — Nath, Goldberg & Meyer; Joshua B. Goldberg

(57) ABSTRACT

The present disclosure provides a method for manufacturing a thin film transistor comprising, forming a pattern of an active layer on a substrate through a patterning process; performing ion doping to a channel region of the active layer; forming a gate insulating layer; forming a pattern of a gate through the patterning process; performing ion doping to a source contact region and a drain contact region of the active layer; forming an interlayer insulating layer; and performing laser annealing to the active layer, so as to make the active layer crystallize and the ions doped in the channel region, the source contact region and the drain contact region of the active layer activate simultaneously. In this method, the crystallization of the active layer and the activation of the ions doped in the active layer are implemented in the same process, which reduces the process cost and improves the efficiency.

11 Claims, 3 Drawing Sheets

METHOD FOR MANUFACTURING THIN FILM TRANSISTOR

FIELD

The present disclosure belongs to the field of display technology, and specifically relates to a method for manufacturing a thin film transistor (TFT).

BACKGROUND

Low temperature poly-silicon (LTPS) has high mobility and stability, so the technology for forming thin film transistors using the LTPS material has been rapidly developed. A new generation of liquid crystal displays (LCDs) or organic light-emitting diodes (OLEDs) derived from the LTPS has become an important display technology.

However, in the process of manufacturing a low temperature poly-silicon (hereinafter referred as p-Si) thin film transistor (LTPS TFT), dehydrogenation is usually performed after a-Si deposition, then an excimer laser annealing (ELA) process is performed, large grain boundary protrusions are produced after amorphous silicon (hereinafter referred as a-Si) crystallization, and this will affect the performance of the thin film transistor. Moreover, after ion doping, a channel region, a source contact region and a drain contact region of an active layer of the thin film transistor further need to be activated to activate the doped ions, which not only increases the process cost, but also results in low process efficiency.

SUMMARY

The present disclosure provides a method for manufacturing a thin film transistor with a simple process and low cost, including, forming a pattern of an active layer on a substrate;
performing ion doping to a channel region of the active layer;
forming a gate insulating layer;
forming a pattern of a gate;
performing ion doping to a source contact region and a drain contact region of the active layer;
forming an interlayer insulating layer; and
performing laser annealing to the active layer of the substrate with the interlayer insulating layer, so as to make the active layer crystallize and the ions doped in the channel region, the source contact region and the drain contact region of the active layer activate simultaneously.

Optionally, the laser annealing includes laser annealing from a side of the substrate opposite to the active layer.

Optionally, the method further includes a step of forming a protection layer on the interlayer insulating layer before the laser annealing.

Optionally, the laser annealing includes: forming a photoresist layer on the interlayer insulating layer, and performing laser annealing to the active layer through a mask over the photoresist layer.

Optionally, the laser annealing has a scan energy of 350-450 mJ/cm$^2$.

Optionally, the ion doping to the channel region of the active layer is performed with a doping voltage of 12-15 KeV, a doping amount of 1E12-2E12 n/cm$^2$, and a gas source of $BF_3$. The ion doping to the source contact region and the drain contact region of the active layer is performed with a doping voltage of 25-30 KeV, a doping amount of 4E14-5E14 n/cm$^2$, and a gas source of $BF_3$.

Optionally, the material of the active layer forms p-Si after laser annealing and crystallization.

Optionally, forming a pattern of an active layer on a substrate includes,
forming a semiconductor material layer on the substrate;
dehydrogenating the resulting semiconductor material layer; and
forming a pattern of the active layer by a patterning process.

Optionally, the dehydrogenating is performed at a temperature of 400-450° C. for 60-90 min.

Optionally, before forming a pattern of an active layer, the method further includes forming a buffer layer on the substrate.

Optionally, after the laser annealing, the method further includes,
forming via holes in the gate insulating layer and the interlayer insulating layer, the positions of the via holes corresponding to the positions of the source contact region and the drain contact region of the active layer; and
forming a source electrode and a drain electrode, wherein the source electrode is connected with the active layer through the via hole corresponding to the source contact region, and the drain electrode is connected with the active layer through the via hole corresponding to the drain contact region.

DETAILED DESCRIPTION OF EMBODIMENTS

The present disclosure will be further described in detail in combination with the accompanying drawings and specific embodiments, in order to make the person skilled in the art have a better understanding of the technical solutions of the present invention.

Figure 1:
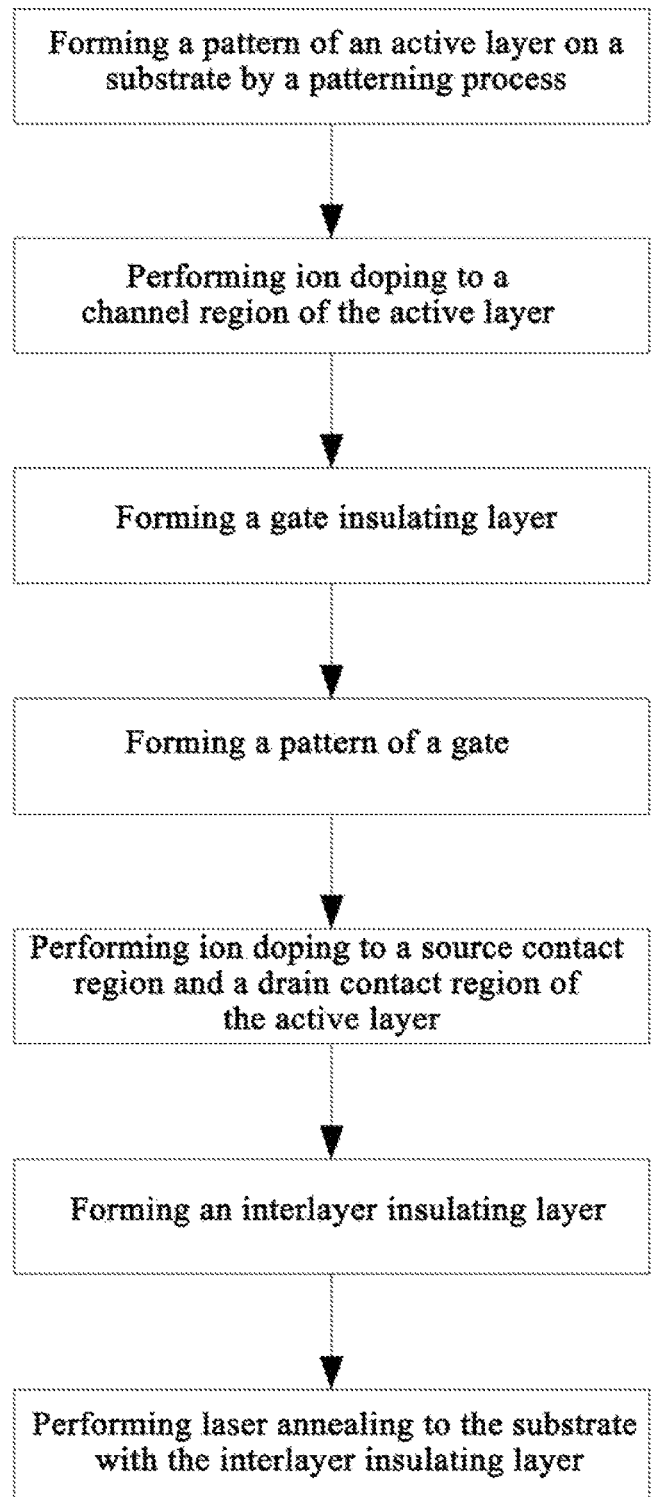
FIG. 1 is a flow diagram of a method for manufacturing a thin film transistor according to an embodiment of the present disclosure.

As shown by the flow diagram in FIG. 1, a method for manufacturing a low temperature poly-silicon thin film transistor according to the present disclosure includes, forming a pattern of an active layer 2 on a substrate 10 by a patterning process;

performing ion doping to a channel region of the active layer 2;

forming a gate insulating layer 3;

forming a pattern of a gate 4 by a patterning process;

performing ion doping to a source contact region and a drain contact region of the active layer 2;

forming an interlayer insulating layer 5; and performing laser annealing to the active layer of the substrate 10 with the interlayer insulating layer, so as to make the active layer 2 crystallize and the ions doped in the channel region, the source contact region and the drain contact region of the active layer 2 activate simultaneously.

Herein, the patterning process described in the present disclosure may be any known process capable of forming a pattern in the art, including photolithography, etching, printing, ink jet or the like or a combination thereof. The person skilled in the art could select a suitable patterning process according to the patterning requirement in practical application.

The method for manufacturing a thin film transistor in the present disclosure will be described below in combination with specific embodiments.

Figure 2:
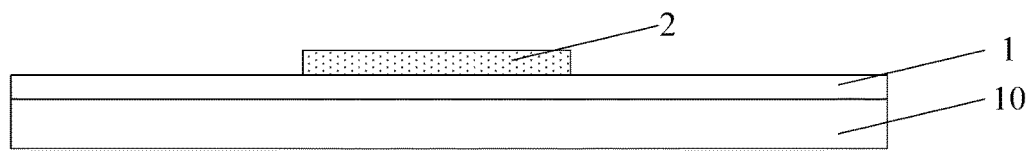
FIG. 2 is a schematic diagram of forming a pattern of an active layer in the method for manufacturing a thin film transistor according to an embodiment of the present disclosure.

A buffer layer 1 and a semiconductor material layer (a-Si film layer) are successively deposited on a substrate 10, and a pattern of an active layer 2 is formed by a patterning process, as shown in FIG. 2.

The substrate 10 is made of a transparent material such as glass and is pre-cleaned. Specifically, the buffer layer 1 and the semiconductor material layer are formed on the substrate 10 by adopting a sputtering method, a thermal evaporation method, a plasma enhanced chemical vapor deposition (PECVD) method, a low pressure chemical vapor deposition (LPCVD) method, an atmospheric pressure chemical vapor deposition (APCVD) method or an electron cyclotron resonance chemical vapor deposition (ECR-CVD) method, and then the pattern of the active layer 2 is formed by a patterning process (specifically by film formation, exposure, development, and wet etching or dry etching). Finally, the active layer 2 is dehydrogenated so that the hydrogen content in the active layer 2 is less than 2%.

The buffer layer 1 may be of a two-layer structure including a silicon nitride layer and a silicon oxide layer, wherein the thickness of the silicon nitride layer is 600-1000 Å and the thickness of the silicon oxide layer is 2500-3000 Å. The thickness of the semiconductor material layer is 450-500 Å. The dehydrogenation of the active layer 2 is performed at a temperature of 400-450° C. for 60-90 min.

Figure 3:
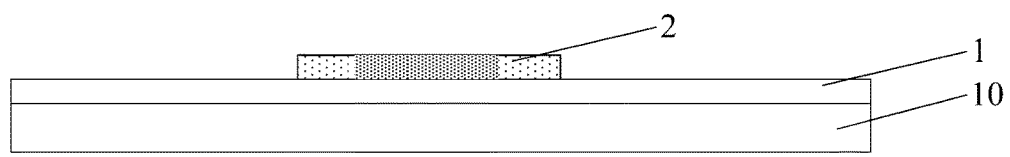
FIG. 3 is a schematic diagram of performing ion doping to a channel region of the active layer 2 in the method for manufacturing a thin film transistor according to an embodiment of the present disclosure.

As shown in FIG. 3, ion doping is performed to the channel region of the active layer 2. The ion doping is performed with a doping voltage of 12-15 KeV, a doping amount of 1E12-2E12 $n/cm^2$, and a gas source of $BF_3$.

Figure 4:
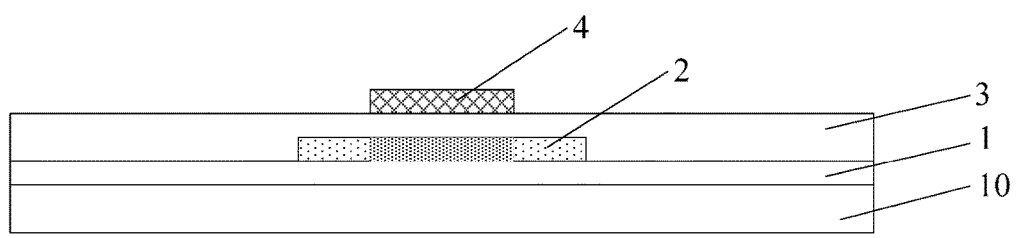
FIG. 4 is a schematic diagram of forming a gate insulating layer 3 in the method for manufacturing a thin film transistor according to an embodiment of the present disclosure.

As shown in FIG. 4, a gate insulating layer 3 and a metal film of a gate 4 are formed and a pattern of the gate 4 is formed by a patterning process.

Specifically, a gate insulating layer is first formed on the active layer 2 by adopting a plasma enhanced chemical vapor deposition method, a low pressure chemical vapor deposition method, an atmospheric pressure chemical vapor deposition method, an electron cyclotron resonance chemical vapor deposition method or a sputtering method; next, a gate metal film is formed by adopting a sputtering method, a thermal evaporation method, a plasma enhanced chemical vapor deposition method, a low pressure chemical vapor deposition method, an atmospheric pressure chemical vapor deposition method or an electron cyclotron resonance chemical vapor deposition method; and finally, a pattern of the gate 4 is formed by adopting a patterning process.

The gate insulating layer 3 includes a silicon dioxide layer and a silicon nitride layer arranged successively in a direction away from the substrate 10, wherein the thickness of the silicon dioxide layer is 800-1000 Å and the thickness of the silicon nitride layer is 400-500 Å. The gate 4 is made of Mo and has a thickness of 2200-2400 Å.

Figure 5:
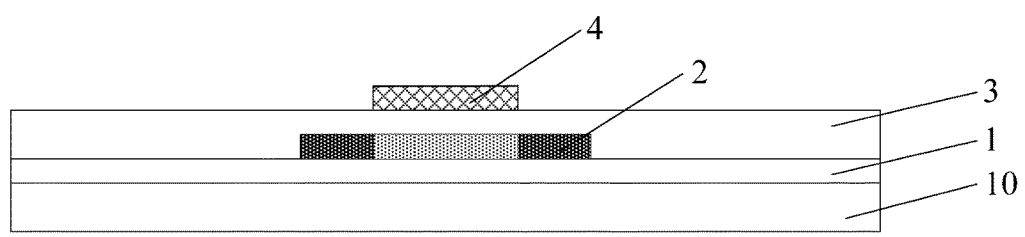
FIG. 5 is a schematic diagram of forming a pattern of a gate 4 in the method for manufacturing a thin film transistor according to an embodiment of the present disclosure.

As shown in FIG. 5, using the pattern of the gate 4 as a mask, ion doping is performed to the source contact region and the drain contact region of the active layer 2 by ion implantation, thereby enhancing the ohmic contact between the active layer 2 and the source and drain electrodes and ensuring good ohmic contact between the resulting poly-silicon and the source and drain electrodes. The ion doping is performed with a doping voltage of 25-30 KeV, a doping amount of 4E14-5E14 $n/cm^2$, and a gas source of $BF_3$.

The ion implantation method may be selected from an ion implantation method with a mass analyzer, an ion cloud implantation method without a mass analyzer, a plasma implantation method or a solid-state diffusion implantation method.

Figure 6:
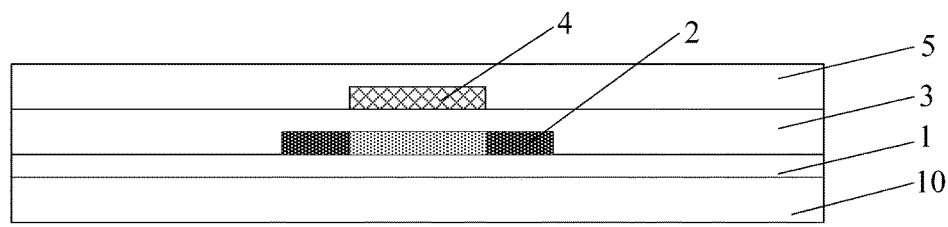
FIG. 6 is a schematic diagram of performing ion doping to a source contact region and a drain contact region of the active layer 2 in the method for manufacturing a thin film transistor according to an embodiment of the present disclosure.

As shown in FIG. 6, an interlayer insulating layer 5 is formed on the gate 4 by adopting a plasma enhanced chemical vapor deposition method, a low pressure chemical vapor deposition method, an atmospheric pressure chemical vapor deposition method, an electron cyclotron resonance chemical vapor deposition method or a sputtering method. The interlayer insulating layer 5 includes a silicon dioxide layer and a silicon nitride layer arranged successively in a direction away from the substrate 10, wherein the thickness of the silicon dioxide layer is 1500-2000 Å and the thickness of the silicon nitride layer is 2500-3000 Å.

Figure 7:
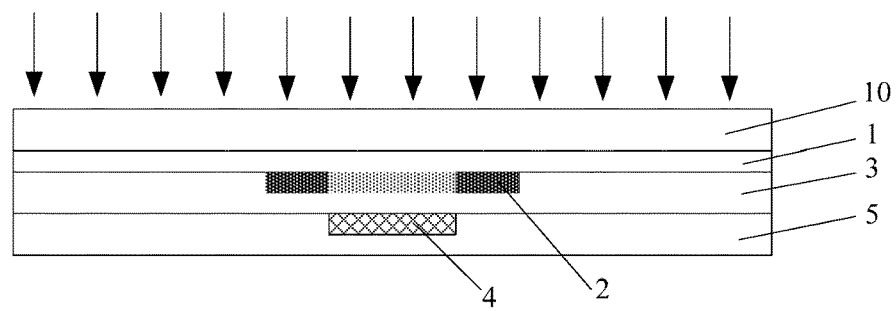
FIG. 7 is a schematic diagram of forming an interlayer insulating layer 5 in the method for manufacturing a thin film transistor according to an embodiment of the present disclosure.

As shown in FIG. 7, the substrate 10 obtained by the above steps is turned over, and a laser annealing is performed from the side of the substrate 10 opposite to the above-mentioned layers, so as to make the active layer 2 convert from a-Si to p-Si and the ions doped in the channel region, the source contact region and the drain contact region of the active layer 2 activate simultaneously. The laser annealing has a scan energy of 350-450 $mJ/cm^2$.

Some embodiments also include forming a source electrode and a drain electrode subsequently.

Figure 8:
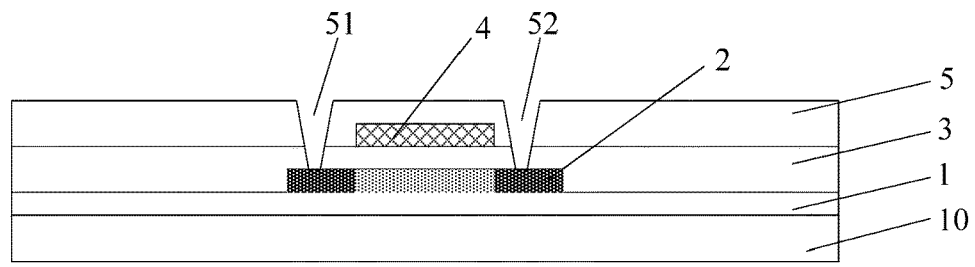
FIG. 8 is a schematic diagram of performing laser annealing to a active layer of a substrate 10 with the interlayer insulating layer in the method for manufacturing a thin film transistor according to an embodiment of the present disclosure.

Via holes 51 and 52 are etched in the gate insulating layer 3 and the interlayer insulating layer 5, and the positions of the via holes correspond to the positions of the source contact region and the drain contact region of the active layer 2 respectively, as shown in FIG. 8.

Figure 9:
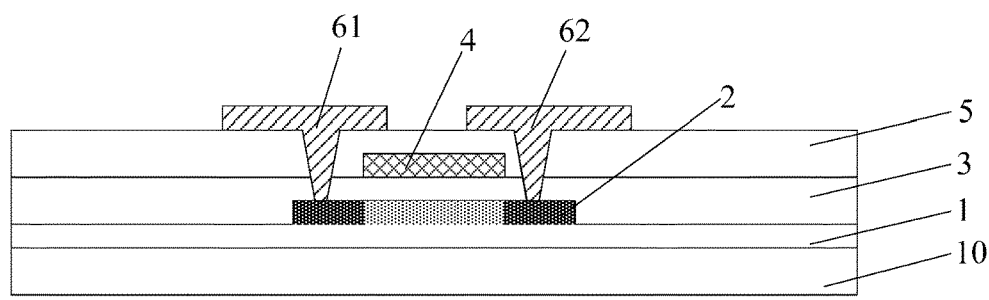
FIG. 9 is a schematic diagram of forming a source electrode and a drain electrode in the method for manufacturing a thin film transistor according to an embodiment of the present disclosure.

A source electrode 61 and a drain electrode 62 are formed on the interlayer insulating layer 5 through a patterning process, as shown in FIG. 9.

A metal film for the source and drain electrodes can be deposited by adopting a plasma enhanced chemical vapor deposition method, a low pressure chemical vapor deposition method, an atmospheric pressure chemical vapor deposition method or an electron cyclotron resonance chemical vapor deposition method, and then the source and a drain electrodes are formed by a patterning process.

According to other embodiments of the present invention, the laser annealing may also be implemented by the following processes:

forming a photoresist layer on the interlayer insulating layer 5, and then performing laser annealing to the active layer 2 through a mask over the photoresist layer; or forming a surface protection layer on the interlayer insulating layer 5, and then performing laser annealing to the active layer 2 from the side of the substrate 10 opposite to the active layer 2.

In the method for manufacturing a thin film transistor according to the present disclosure, the laser annealing is performed after the interlayer insulating layer 5 is formed on the substrate 10, so that large grain boundary protrusions would be avoided after a-Si crystallization and the contact interface between the active layer 2 and the gate insulating layer 3 is effectively improved, thereby improving characteristics of the thin film transistor (especially the leakage current).

In addition, by using the method of the present disclosure, crystallization of the active layer 2 and activation of the ions doped in the channel region, the source contact region and the drain contact region of the active layer 2 are accomplished at the same time. That is to say, crystallization of the active layer and the activation of the doped ions are implemented in the same process, thus improving the efficiency and reducing the process cost.

It could be understood that the above embodiments are merely exemplary embodiments for illustrating the principle of the present disclosure, but the present disclosure is not limited thereto. Various variations and improvements may be made for those of ordinary skill in the art without departing from the spirit and essence of the present disclosure, and these variations and improvements are also encompassed within the protection scope of the present disclosure.

The invention claimed is:

1. A method for manufacturing a thin film transistor, comprising
    forming a pattern of an active layer on a substrate;
    performing ion doping to a channel region of the active layer;
    forming a gate insulating layer;
    forming a pattern of a gate;
    performing ion doping to a source contact region and a drain contact region of the active layer;
    forming an interlayer insulating layer; and
    performing laser annealing to the active layer of the substrate with the interlayer insulating layer, so as to make the active layer crystallize and the ions doped in the channel region, the source contact region and the drain contact region of the active layer activate at the same time.

2. The method for manufacturing a thin film transistor according to claim 1, wherein the laser annealing comprises,
    performing laser annealing from a side of the substrate opposite to the active layer.

3. The method for manufacturing a thin film transistor according to claim 2, wherein before performing laser annealing from the side of the substrate opposite to the active layer, the method further comprises,
    forming a surface protection layer on the interlayer insulating layer.

4. The method for manufacturing a thin film transistor according to claim 1, wherein the laser annealing comprises,
    forming a photoresist layer on the interlayer insulating layer, and
    performing laser annealing to the active layer through a mask over the photoresist layer.

5. The method for manufacturing a thin film transistor according to claim 1, wherein the laser annealing has a scan energy of 350-450 mJ/cm$^2$.

6. The method for manufacturing a thin film transistor according to claim 1, wherein the ion doping on the channel region of the active layer is performed with a doping voltage of 12-15 KeV, a doping amount of 1E12-2E12 n/cm$^2$, and a gas source of BF3; and the ion doping on the source contact region and the drain contact region of the active layer is performed with a doping voltage of 25-30 KeV, a doping amount of 4E14-5E14 n/cm$^2$, and a gas source of $BF_3$.

7. The method for manufacturing a thin film transistor according to claim 1, wherein material of the active layer forms p-Si after laser annealing and crystallization.

8. The method for manufacturing a thin film transistor according to claim 1, wherein forming a pattern of an active layer comprises,
    forming a semiconductor material layer on the substrate;
    dehydrogenating the resulting semiconductor material layer; and
    forming a pattern of the active layer by a patterning process.

9. The method for manufacturing a thin film transistor according to claim 8, wherein the dehydrogenating is performed at the temperature of 400-450° C. for 60-90 min.

10. The method for manufacturing a thin film transistor according to claim 1, wherein before forming the active layer, the method further comprises,
    forming a buffer layer on the substrate.

11. The method for manufacturing a thin film transistor according to claim 1, wherein after the laser annealing, the method further comprises,
    forming via holes in the gate insulating layer and the interlayer insulating layer, wherein the positions of the via holes corresponding to the positions of the source contact region and the drain contact region of the active layer; and
    forming a source electrode and a drain electrode, wherein the source electrode is connected with the active layer through the via hole corresponding to the source contact region, and the drain electrode is connected with the active layer through the via hole corresponding to the drain contact region.

* * * * *